United States Patent [19]

Stengl et al.

[11] Patent Number: 5,436,460
[45] Date of Patent: Jul. 25, 1995

[54] ION-OPTICAL IMAGING SYSTEM

[75] Inventors: Gerhard Stengl, Wernberg; Alfred Chalupka, Vienna; Herbert Vonach, Klosterneuberg, all of Austria

[73] Assignee: IMS Ionen Mikrofabrikations Systeme Gesellschaft m.b.H., Vienna, Austria

[21] Appl. No.: 58,911

[22] Filed: Apr. 26, 1993

Related U.S. Application Data

[63] Continuation-in-part of Ser. No. 932,356, Aug. 19, 1992.

Foreign Application Priority Data

[30]

Aug. 20, 1991 [AT] Austria .................................. 1634/91

[51] Int. Cl.[6] ...................... H01J 37/317; H01J 37/10
[52] U.S. Cl. ................................. 250/492.21; 250/398
[58] Field of Search ............................ 250/492.21, 398

[56] References Cited

U.S. PATENT DOCUMENTS

| 3,937,958 | 2/1976 | Rusch et al. | 250/307 |
| 4,894,549 | 1/1990 | Stengl | 250/492.21 |
| 4,985,634 | 1/1991 | Stengl et al. | 250/492.21 |

*Primary Examiner*—Bruce C. Anderson
*Attorney, Agent, or Firm*—Herbert Dubno

[57] ABSTRACT

A system for ion-beam imaging of a structure of a mask on a wafer has a two-lens set between the mask and the wafer which is made up of a preferably accelerating Einzel lens proximal to the mask and an asymmetric accelerating Einzel proximal to the wafer.

10 Claims, 6 Drawing Sheets

ION-OPTICAL IMAGING SYSTEM

CROSS REFERENCE TO RELATED APPLICATION

This application is a continuation in part of Ser. No. 07/932,356 filed 19 Aug. 1992 and this application is related to the commonly owned copending application Ser. No. 07/912,099 filed 10 Jul. 1992 and based upon Austrian application A 1388/91 of 10 Jul. 1991 under the International Convention.

FIELD OF THE INVENTION

Our present invention relates to an ion-optical imaging system for producing an image on a wafer, especially a silicon wafer or other substrate for the production of integrated circuitry and the like by a lithographic process.

More particularly, the invention relates to an imaging system in which between the structured mask, having one or more openings forming the structure to be imaged by an ion beam on the wafer, and the wafer itself, a combination or set of two collecting lenses is provided so that the mask lies approximately in the object-side focal plane of the first lens following the mask and the wafer lies in the vicinity of the image-side focal plane of the second collecting lens following the mask and, preferably, the crossover of the first lens lies substantially in the object side focal plane of this second lens.

BACKGROUND OF THE INVENTION

Reference may be made to one or more of the following patent documents: European patent application 87 89 0020.8 filed 30 Jan. 1987 and published as 0 231 164A2 on 5 Aug. 1987 citing as inventors Dr. Hans Loeschner, Dr. Gerhard Stengl and Dr. Peter Wolf; U.S. Pat. No. 4,823,011 issued 18 Apr. 1989 to Gerhard Stengl and Hans Loeschner; U.S. Pat. No. 4,985,634 issued 15 Jan. 1991 to Gerhard Stengl and Hilton F. Glavish, all commonly owned with the present application, and to the references and documents cited therein. Reference may also be made to U.S. Pat. No. 4,563,587 (Ward et al), U.S. Pat. No. 4,740,694 (Nishimura et al) and U.S. Pat. No. 4,755,685 (Kawanami et al).

As will be apparent from these documents among others, the production of semiconductor components can be effected by lithography utilizing a series of steps, in one of which a structure of a mask may be imaged upon a wafer.

In a simplified version, the lithographic process for producing semiconductor components begins with the application of a thin layer of a light-sensitive material, referred to generally as a photoresist or simply as a resist, upon a wafer forming the semiconductor substrate, generally a silicon wafer.

A lithographic apparatus projects a structure of a mask upon the resist coating of the wafer and usually the extent of the projected structure on the wafer is much smaller than the area of the wafer. Subsequently, the wafer is shifted and the structure of the mask is then projected on another location of the wafer.

These steps of projection and shifting are repeated until the entire wafer surface is used.

The resist is then developed and the wafer has a desired pattern in the form of a multiplicity of resist-free locations or zones. In subsequent steps, the wafer can be subjected to processes such as etching, ion implantation or ablation and diffusion of doping materials to form the desired local compositions and structures.

After these further steps, the wafer is inspected, coated again with a resist, and subjected once more to the lithographic steps so that after 8 to 15 repetitions of these steps, a checkerboard arrangement of substantially identical microcircuits are formed on the wafer. The wafer can then be cut up, the microcircuits encapsulated and provided with terminals, etc.

Most of the present-day projection lithographic processes utilize light to irradiate the resist. However, the need for ever smaller structures and higher densities of the components of the macrocircuits has resulted in intensive research into other irradiation methods which are not limited in their resolution to that of light with relatively large wavelengths. For example, the use of X-rays has been attempted and also other processes like ion-beam lithography, although these methods have not found as widespread an application as the light-beam photolithographic processes.

OBJECTS OF THE INVENTION

It is, therefore, the principal object of the present invention to provide an improved ion-optical imaging system which avoids the limitations and drawbacks of existing systems and thus can provide high resolution and efficient lithographic imaging of the structure of a mask upon a substrate.

Another object of the invention is to provide an improved ion-beam lithographic system for the production of microcircuits on a wafer or like substrate.

SUMMARY OF THE INVENTION

We have discovered that these objects can be attained by providing the lens system between the mask and the wafer as a specific combination of two collecting lenses as will be detailed below.

More particularly, the imaging system of the invention comprises:

a mask having a structure to be imaged upon a wafer and including at least one opening;

means for supporting the wafer upon which the structure is to be imaged at a distance from the mask along an optical axis; and a lens system disposed between the mask and the wafer and essentially consisting of a set of two collecting electrostatic lenses including a first collecting lens following the mask along the axis in a direction of ion beam travel toward the wafer, and a second collecting lens spaced from and following the first collecting lens along the axis in the direction of ion beam travel, the mask being disposed approximately in the object-side focal plane of the first collecting lens proximal to the mask, the wafer being positioned in a vicinity of the image-side focal plane of the second collecting lens following the mask, and the set is constituted of:

an Einzel lens, especially an accelerating Einzel lens as the first lens and an accelerating asymmetric Einzel lens as the second lens upstream of the wafer following the mask. Thus the accelerating Einzel lens is the first collecting lens following the mask and the accelerating asymmetric Einzel lens is the second collecting lens following the mask and immediately precedes the wafer in the direction of beam travel.

The reference to an Einzel lens is a reference to a system having along the optical axis three coaxial rotationally symmetrical electrodes of which the first and third are at the same potential and the central electrode is of a different potential (see U.S. Pat. No. 4,985,634 for a more detailed description of the Einzel lens).

If the ions are initially accelerated upon entry of the lens and are braked in the second half of the lens again to the original energy, one refers to the lens as an accelerating Einzel lens.

In the opposite case, the lens is referred to as a decelerating Einzel lens.

In the overall sense, the particle energy does not change in passage through the Einzel lens since the beginning and end thereof are at the same potential.

An asymmetric Einzel lens is understood to be an Einzel lens as described in which the three electrodes are at three different potentials. In this case, upon passage of the beam through the lens, the particles undergo a change in particle energy and, in the same manner as was used to describe the immersion lens, we can refer to an accelerating or decelerating asymmetric Einzel lens when, during passage through the lens, the particles encounter a potential which increases from the first electrode to the third electrode or decreases from the first electrode to the third electrode to respectively increase or decrease the ion energy.

Asymmetric Einzel lenses are employed since they have reduced image errors (distortion) than the corresponding immersion lenses for the same starting and ending voltages and the same electrode diameter.

Since the spherical aberration of an asymmetric Einzel lens is approximately one order of magnitude smaller than is characteristic of immersion lenses, the use of an asymmetric Einzel lens as the second lens of the system, immediately ahead of the wafer, provides a reduction in the residual distortion determining the image quality at the site of the distortion minimum by also about one order of magnitude. This is a consequence of the fact that at the site of the distortion minimum the coefficient of the fifth order distortion is substantially the sum of the products of the third order distortion coefficients of the two collecting lenses of the imaging system (a consequence of the multiplication of the two transfer matrices) and thus the reduction of errors even in one lens results in a corresponding improvement of the image quality of the complete system.

Because of the use of an asymmetric Einzel lens, i.e. a three element lens, two voltage ratios (U2/U1 or U3/U1) can be freely selected in terms of the ratios between the voltages at the middle electrode (U2) and the voltage at the incoming side electrode (U1) and between the voltages of the outgoing side electrode (U3) and the voltage at the incoming side electrode (U1). This provides an additional degree of freedom for optimizing the overall system and enables ion optical imaging systems with special characteristics to be easily formed.

By contrast, we note that with the use of an immersion lens which has only two electrodes, the optimization of the overall system can be effected with a predetermined lens geometry only for a certain ratio between the voltages at the two electrodes of the immersion lens, i.e. the ratio of the ion energy at the wafer to the ion energy at the mask is fixed. By the use of an asymmetric Einzel lens and variation of both of the aforementioned voltage ratios at the electrodes, the optimized system with a minimum of distortion and chromatic aberration at the site of the Gaussian image point of the mask and a telecentric beam path can have a wide range of ratios between the two voltages at the two terminal electrodes and thus of ion energy ratios between wafer and mask.

With the aid of this two lens combination it is possible to irradiate the resist with very low energy ions. As a result, with substantially higher depth of focus by comparison with earlier systems submicron structures of less than 0.25 $\mu$m can be realized.

In practice with the ion projection lithographic system of the invention, the illumination of the mask is not effected directly by the ion source. Rather an illumination system is provided upstream of the mask in the direction of travel of the ion beam so that the position of the virtual source point for illumination of the mask can be varied at will and thus the distance between the true ion source and the mask can be provided so that it does not exceed about 3 to 4 m, as is important on structural grounds.

For the virtual source, however, greater distances are desirable on two grounds. In one case, the greater distance allows optimal freedom from distortion (see the examples) by providing the beam impinging on the mask so it is approximately parallel; this normally would require a distance between the virtual ion source and the mask of several tens of meters.

The second reason is that, for mask stability, a thickness of the mask of several $\mu$m is required and this means that aberration resulting from the mask thickness should be avoided by having the ion beam impinge as perpendicularly to the mask as possible. For example, for small structures of the mask, like a 0.5 $\mu$m wide slit, to be imaged on the wafer without significant casting of shadows, the angle of incidence of the ions against the mask must be limited to about 0.1° or less. For a mask size of 60×60 mm$^2$, this also leads to a similar minimum distance of the virtual ion source from the mask.

It should be noted further that each ion source emits, in addition to the desired ions, a number of undesirable ion types which should be eliminated before the ion beam impinges upon the wafer.

According to the invention, therefore, the illumination device for the mask in the ion-optical imaging system of the invention comprises a so-called ion source lens which may be constituted as an accelerating or decelerating Einzel lens and a mass separator formed as an E×B filter immediately following the ion source lens.

A so-called illumination lens follows the mass separator and can, alternatively, be constituted as an immersion lens or as an accelerating or decelerating Einzel lens or as one or more solenoids.

An immersion lens is understood to be a system in which along the optical axis two coaxial rotationally symmetrical electrodes, e.g. two coaxial tubes, are provided at different potentials and spaced by a gap. If the ions at the transition between the first and second electrode are accelerated, the immersion lens is referred to as an accelerating immersion lens. If the ions in this transition between the first and second electrodes are decelerated, the lens is referred to as a decelerating immersion lens. At the inlet and outlet side and to reduce the length of the lenses, they may be provided with closure diaphragms whose openings are provided only of the requisite sizes for the ion beam passage.

In such an illumination system, therefore, the Einzel lens of short focal length forms an image of the ion source at the center of the mass separator which can be a Wien filter (E×B filter), i.e. an arrangement with a homogeneous electric field on which a homogeneous magnetic field perpendicular thereto is superimposed. For ions of the desired mass, the forces applied by the two fields compensate each other so that the ions pass axially through the system. For all other ions, this is not the case and they are removed from the beam by deflection. Subsequently, the illumination lens generates a virtual image of the ion source thus realizing distances of the virtual ion source from the mask which can range between several tens of meters to several hundreds of meters.

The illumination lens must have a similar high quality as the two collecting lenses since the distortion thereof, in combination with the distortion of the imaging lenses can lead to additional fifth order distortions and can be a great detriment with respect to the overall distortion of the system. As the illumination lens, therefore, we prefer to use an electrostatic Einzel lens whose dimensions and qualities match those of the imaging lenses.

BRIEF DESCRIPTION OF THE DRAWING

The above and other objects, features and advantages of the present invention will become more readily apparent from the following description, reference being made to the accompanying drawing in which.

SPECIFIC DESCRIPTION

In the Figures of the drawing which illustrate the ion beam photolithographic system, the mask is represented diagrammatically at M while the wafer is shown at W and is provided on a support represented at S so designed as to enable the structure of the mask, in the form of one or more holes traversed by the ions of the ion beam, to be imaged at selected locations on the wafer and such that the wafer and the optical axis O of the ion optical system can be stepped transversely to the axis as represented by the arrow T so that a checkerboard pattern of exposure of the wafer can be effected. These principles are set out in the patent documents previously made of record.

As noted, for an ion beam system, the structure of the mask M which is to be imaged upon the wafer, will be generally in the form of openings, e.g. slits or holes, which can be provided in the foil constituting the mask and which can be composed of silicon.

With respect to FIGS. 1–4, the ions are assumed to derive from an ion source Q of a very small virtual size which may be approximately 10 μm in diameter or less and which is located at some distance from the mask M.

Figure 1:
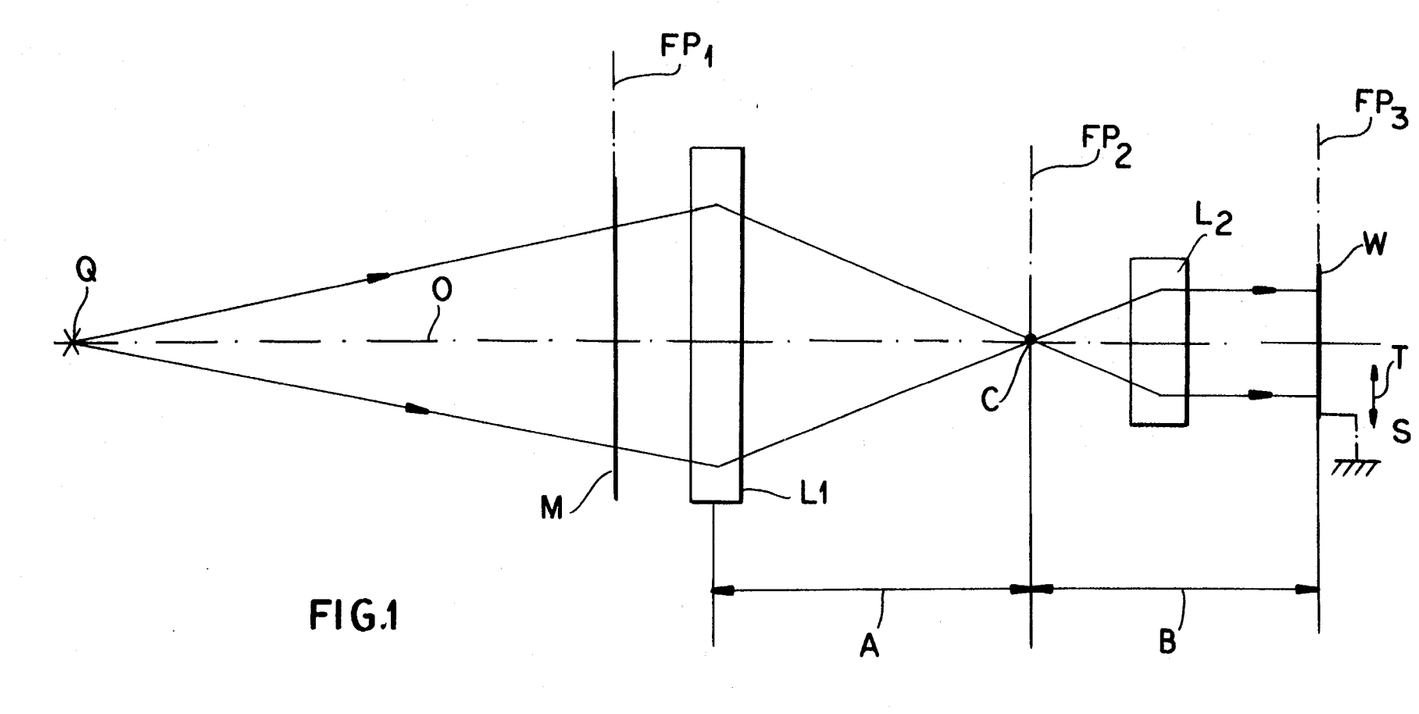
FIG. 1 is a schematic illustration of the beam path in an ion beam projection lithographic system with two collecting lenses according to the invention.

The mask M is located approximately in the focal plane $FP_1$ of a first collecting lens L1.

This collecting lens L1 has a crossover (real image of the ion source Q) at the location C, shortly behind its image-side focal point if the distance between the ion source Q and the lens L1 immediately following the mask, i.e. the first lens in the direction of beam travel D is large when compared with the focal length of the collecting lens L1. The wafer W lies in the vicinity of the image side focal plane $FP_3$ of the second lens L2.

The object side focal point of the second collecting lens L2 located ahead of the wafer W preferably lies in the plane $FP_2$ at the crossover C. As a result, the beam of ions leaves the collecting lens L2 substantially parallel to the axis and the result is an approximately telocentric ion-optical system. This has the advantage that the image scale does not change with small shifts in the position of the wafer W along the ion optical axis.

The system utilizes as the collecting lenses L1 and L2, an accelerating Einzel lens and an accelerating asymmetric Einzel lens, respectively.

(a) By this combination of the collecting lenses L1, L2, the image field containing the structure of the mask is imaged on the wafer W in a plane in vicinity of the image-side focal plane $FP_3$ of the collecting lens L2 located ahead of the wafer W.

(b) The bundle of the beam undergoes a barrel-shaped distortion by the collecting lens L1 following the mask M (region A), the barrel-shape distortion being transformed into a cushion-shaped distortion past the crossover C (region B).

Figure 2:
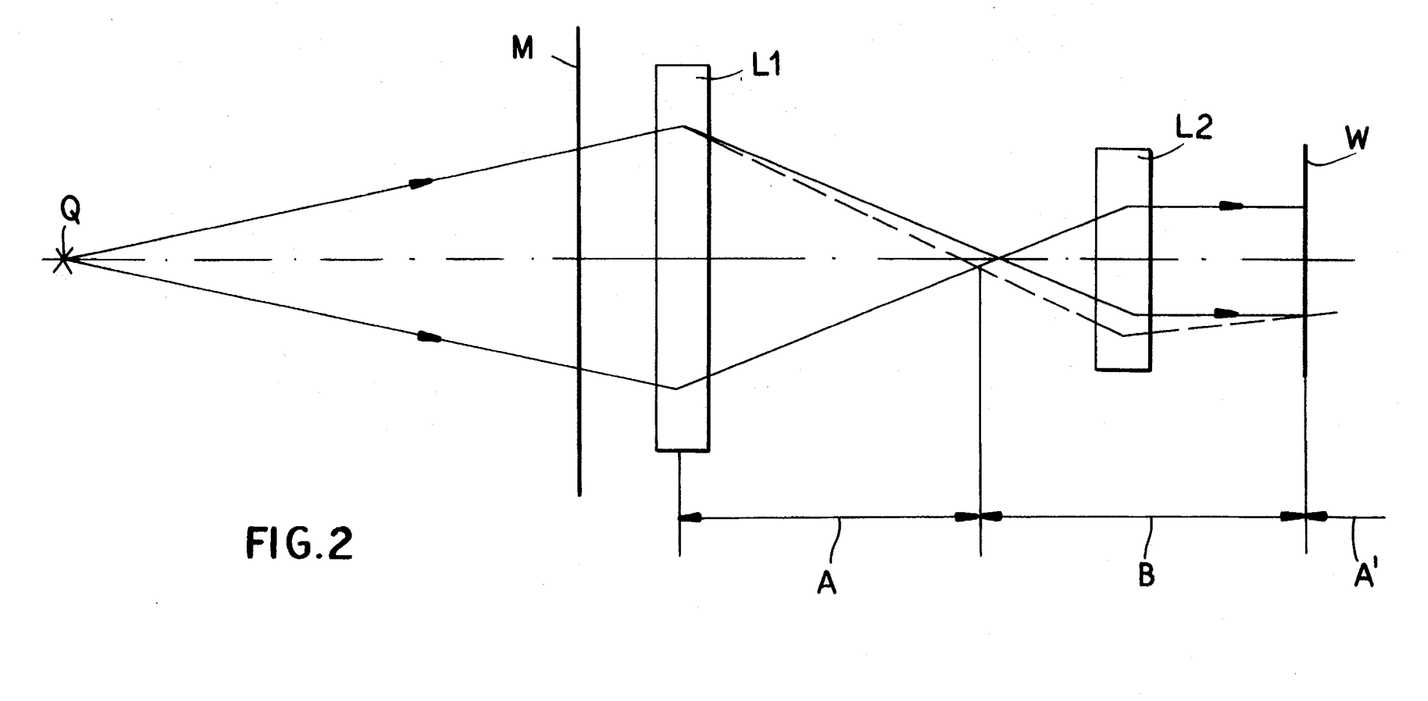
FIG. 2 is a diagram analogous to FIG. 1 showing in solid lines the beam path for ideal distortion-free lenses and, with the broken line, the beam path considering the distortion.

FIG. 2 shows that, because of the distortion ahead of the wafer W at the collecting lens L2, the beam undergoes an additional refraction which reduces this cushion-shaped distortion (region B) and again yields a barrel-shaped distortion in the region A'. Thus behind the lens L2 located ahead of the wafer W, there is a plane in which the distortion resulting from the two collecting lenses L1 and L2 is compensated. This, however, applies only to distortions of the third order. There remain however distortions of the fifth order, which are very much smaller than distortions of the third order. The distortion, therefore, does not disappear entirely but is substantially reduced. For a given image size, this residual distortion is inversely proportional to the fifth power of the distance between the mask and wafer with uniform change of all dimensions in the optical system between the mask and wafer.

Figure 3:
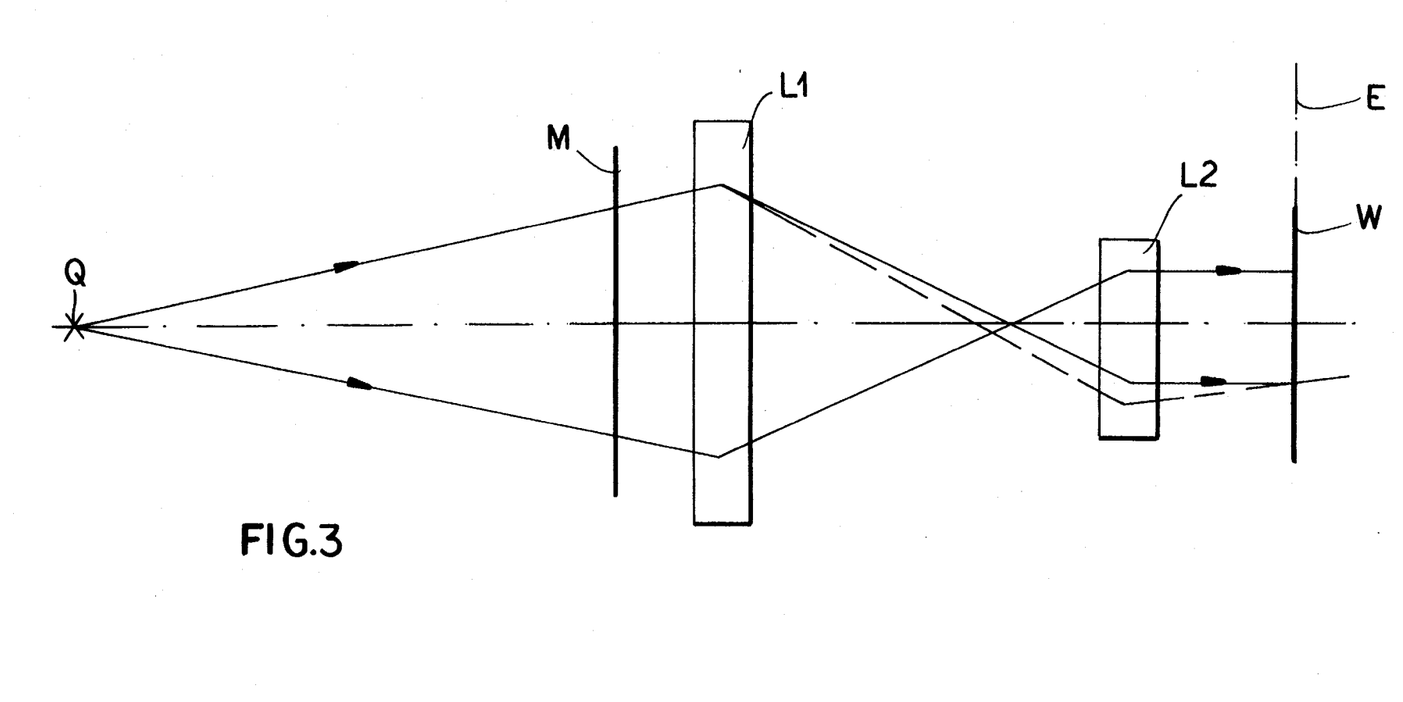
FIG. 3 is a diagram of a system analogous to FIG. 1 in which the solid lines show the beam path with a set point energy $E_0$ and the broken lines shows the beam path at an energy reduced with respect to the set point energy to depict the correction of chromatic aberration.

(c) In the arrangement of FIG. 1, there is also a compensation for chromatic aberrations at a predetermined image plane behind the collecting lens L2 ahead of the wafer W, as is apparent from FIG. 3.

A beam (illustrated in FIG. 3 by broken lines) with somewhat smaller energy $E_o - \Delta E_o$ than the set point energy $E_o$ is more strongly refracted in the first collecting lens L1 following the mask M and thus impinges upon the second lens L2 ahead of the wafer W at a greater distance from the axis than the beam represented in solid lines for the set point energy. The beam with the lower energy and greater refraction meets the set point beam at a predetermined spacing behind the lens L2 located ahead of the wafer W. In this plane E, the chromatic aberrations of a first order disappear. Here as well, there may remain a residual error in the form of chromatic aberrations of the second order, i.e. chromatic aberrations which are proportional to a square of the energy deviation from the set point energy.

(d) The three relevant planes, namely the Gaussian plane of the mask M, the plane of minimum distortion and the plane E of minimal chromatic aberration generally do not coincide.

By appropriate choice of the collecting lenses L1 and L2 and the location of the ion source, it can, however, be ensured that while maintaining a parallel ion beam, these three planes will coincide. If the wafer W is positioned where these three planes coincide, in the image plane of the mask on the wafer W, there will be a minimum of distortion and chromatic aberration.

(e) The image reduction factor (ratio of image size to object size in the optical system), with which the structure of the mask is imaged on the wafer W, is approximately equal to the ratio of the image-side focal length of the first collecting lens L1 following the mask to the object-side focal length of the second collecting lens L2 ahead of the wafer W.

By scaling (for example increasing or decreasing by the same factor all dimensions of lens L2), it is possible to vary the reduction factor of the image system while maintaining all other characteristics, i.e. correction for distortion and the chromatic aberration at the Gaussian image point of the mask.

Figure 6:
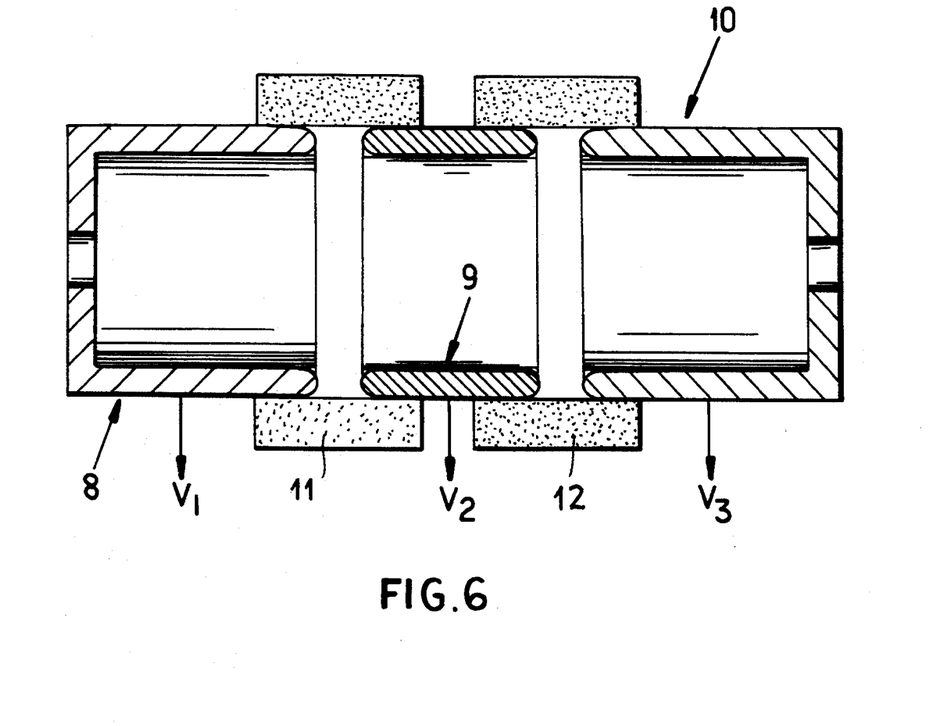
FIG. 6 is an axial longitudinal section of an example of an Einzel lens imaging system according to the invention.

FIG. 6, shows in highly diagrammatic form the basic construction of an Einzel lens (similar to that illustrated in FIG. 9b of Ser. No. 07/912,099). The Einzel lens comprises three electrodes 8, 9, 10 which are received in and are insulated from one another by respective insulating sleeves 11 and 12. In a normal Einzel lens, the electrode 9 is of a potential V2 which is different from the potentials V1 and V3 applied to the terminal electrodes 8 and 10. If the electrodes V1 and V3 are equal and the ions, depending upon the potential V2 are accelerated, the device is referred to as an accelerating Einzel lens (EL+). If the ions are decelerated, the device is referred to as a decelerating Einzel lens (EL−).

If the potentials V1 and V3 of the terminal electrodes 8 and 10 differ from one another, the device is referred to as an asymmetric Einzel lens. Also with an asymmetric Einzel lens, depending upon the potential of the middle electrode 9, the ions can be accelerated or decelerated on passing through the lens and thus one can refer to an accelerating asymmetric Einzel lens (AEL+) or an decelerating asymmetric Einzel lens (AEL−).

Figure 7:
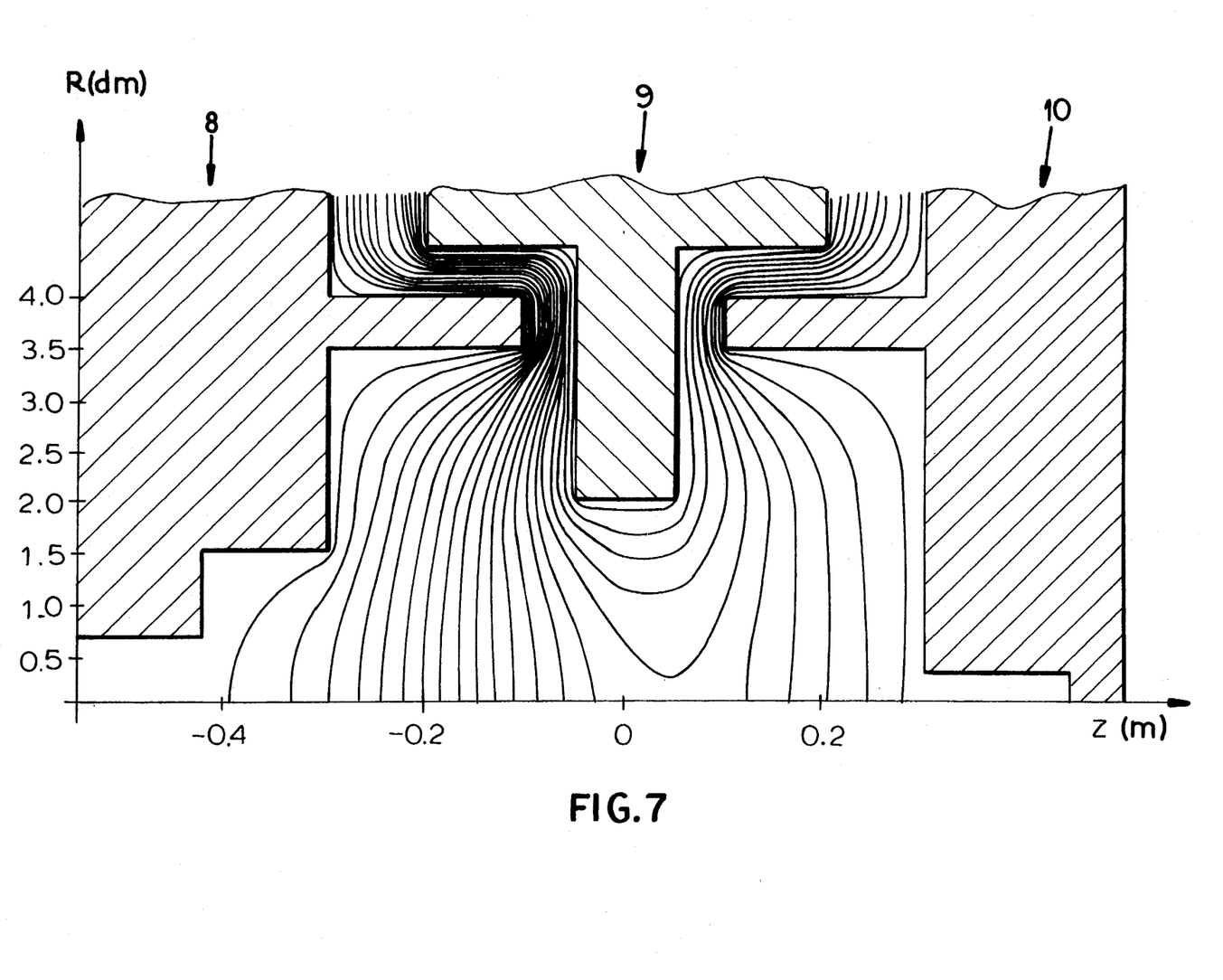
FIG. 7 is another axial section showing an accelerating asymmetric Einzel lens with potential lines depicted thereon.

From FIG. 7 the equipotential lines in an asymmetric Einzel lens will be apparent.

The potentials on the three electrodes 8, 9 and 10 are so chosen that the lens functions as an accelerating asymmetric Einzel lens. Along the abscissa axis, the dimensions in the axial direction are given while along the ordinate direction the dimensions in the radial direction are given assuming the abscissa axis to coincide with the central axis of the lens.

EXAMPLE

As an example, the combination of an accelerating Einzel lens with an accelerating asymmetric Einzel lens with 100% excess voltage (U2/U3=2.0, whereby U2 is the voltage on the middle electrode and U3 is the voltage at the outlet side electrode of the asymmetric Einzel lens) is numerically evaluated.

The analysis of the imaging properties was performed for structure, in a mask field of $60 \times 60$ mm$^2$ which are projected with a reduction factor of 3 onto a safer area of $20 \times 20$ mm$^2$, in accordance with the requirements in the semiconductor industry. Parallel illumination of the mask is realized by an electrostatic illuminating lens BL between the source Q and the mask M (see FIG. 4). The calculation and optimization of the lens system was effected in the following steps.

1. Calculation of the potential distribution for a given lens geometry from the potential equation for the two lenses which are combined. For the Einzel lens L1, a single calculation is sufficient. For the asymmetric Einzel lens L2, the calculation must be carried out for a series of different voltages on the two terminal electrodes. FIG. 7 shows an example for the calculated equipotential lines of the lens used.

2. Calculation of the lens parameters of first, third and fifth orders as a function of the voltage ratio between the electrodes of the lens (or in the case of an asymmetric Einzel lens, the two voltage ratios). This was effected as follows:

Initially the electric field was determined from the potential values calculated from the potential equation and it was found that, to ensure sufficient precision, the two dimensional cubic interpolation was required. Then a number of particle paths through the lens were calculated by numerical integration. These paths were uniformly distributed over the interesting illumination range of the lens.

From the positions of the paths at the lens end, the transfer matrix in the first, third and fifth orders can be determined and at the same time, the errors of the matrix elements can be ascertained. Calculations of this type with different injection energies of the ions yields the transfer matrix for different voltage ratios.

As a result of this series of calculations, the transfer matrix in the fifth order is obtained for the lenses researched as a function of the voltage ratio (or the two voltage ratios in the case of asymmetric Einzel lenses).

3. According to the standard method of matrix multiplication, the beam trajectory through systems comprised of two lenses and drift path segments were calculated from a given starting point (mask) to a given end point (wafer) and the transfer matrix calculated therefrom. The matrices for the lenses as a function of the voltage ratio at the electrodes were taken over from the results of step 2.

Figure 4:
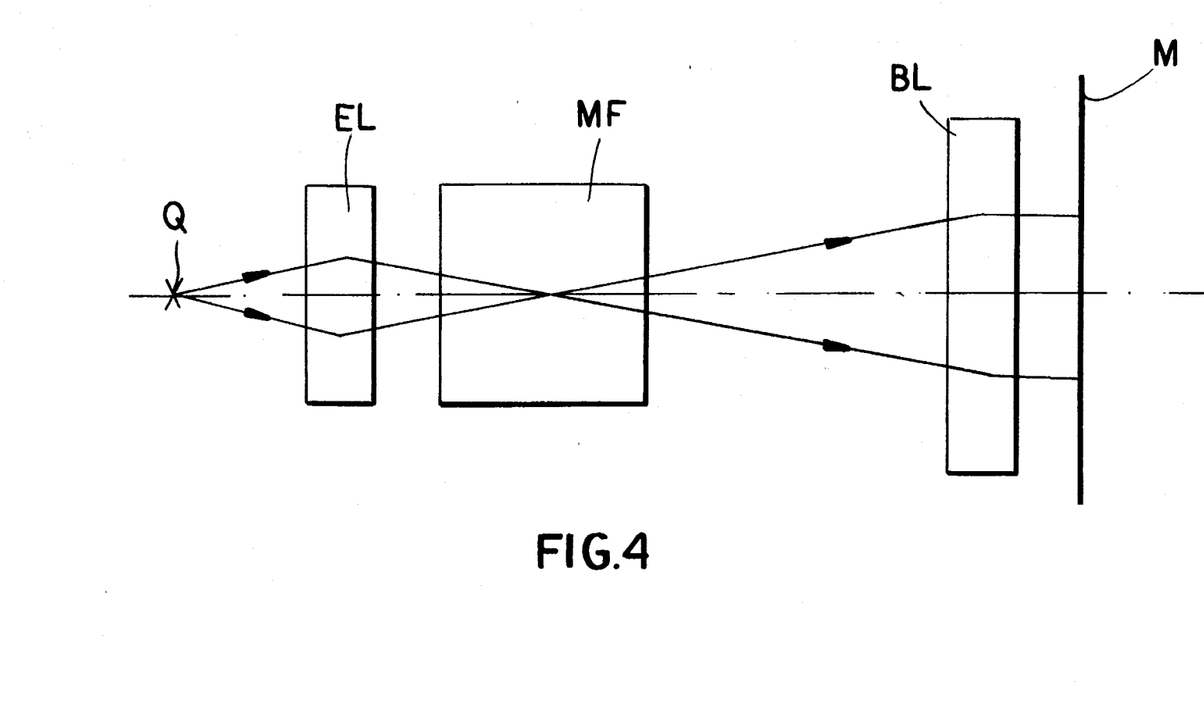
FIG. 4 shows an illumination device, also in highly diagrammatic form, which can be used for the combination of the two collecting lenses of the invention.
Figure 5:
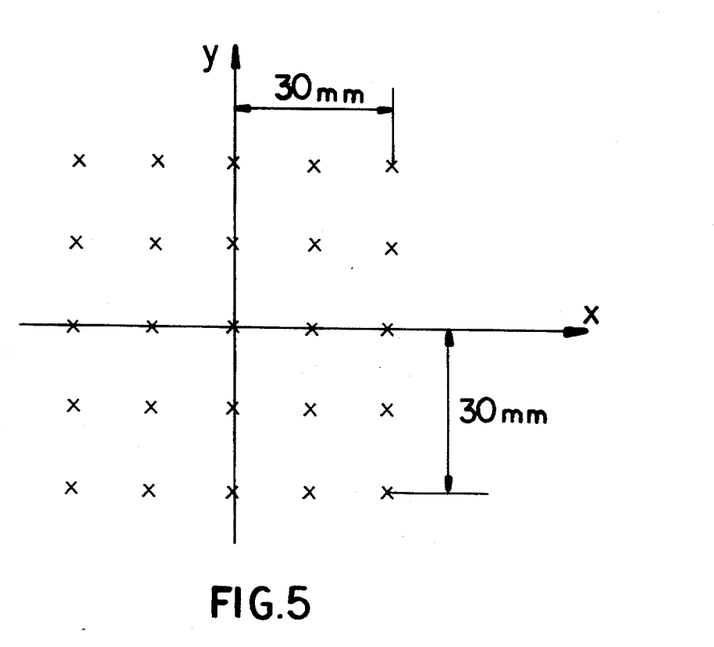
FIG. 5 is a graph showing the positions of the starting points of ions on the mask, the trajectory of the ions having been investigated through the system of two collecting lenses.

From the transfer matrices obtained, the image locations for a series of starting points of the mask are calculated and FIG. 5 shows the starting points utilized in these calculations at the mask (corresponding to FIG. 8 of Ser. No. 07/912,099). The direction of the rays starting from these masks is determined by the assumed position of the ion source and the location and refractive power of the illumination lenses (see FIG. 4) and can also be calculated.

From the positions of the image points, with a linear fit, average and maximum values of the distortion can be obtained from the displacement of the calculated image points from the corresponding fit lines. Furthermore, such image point calculations can be carried out as well for energies which differ by a small amount ($\Delta E_o$) from the set point energy ($E_o$), so that values for chromatic aberration of the lens system can be determined.

4. The imaging system of the invention including the combination of the two lenses can be optimized with respect to image aberrations. By iteration an optimization with regard to a simultaneous minimization of the distortion and chromatic aberration can be obtained and thus, as may be desired, a number of collateral advantages can be obtained.

With the examples given here, the following considerations apply:

1. Collateral conditions which had to be satisfied:
   (1.a) Parallel ion beam at the outlet side of the imaging system, i.e. ahead of the wafer and following the second collecting lens located upstream of the wafer.
   (1.b) A Gaussian image of the mask M on the wafer.
   (1.c) Image reduction of the mask-wafer imaging of ⅓.
2. The following parameters were varied for the purpose of image aberration minimization while maintaining the aforedescribed collateral conditions:
   (2.a) Distance between the mask M and the first lens L1 following the mask L1,
   (2.b) Distance between the two collecting lenses L1 and L2,
   (2.c) Distance between the wafer W and the lens L2 immediately ahead of the wafer, and
   (2.d) The scaling factor, i.e., the reduction or increase in size of the collecting lens L2 immediately ahead of the wafer.
3. For further optimization the voltage ratios between the electrodes of the two collecting lenses L1 and L2 were varied.

The results are given in the following table 1, and can be summarized as follows:

1. An image of the 60×60 mm² mask field with a reduction of three can be obtained on the wafer with a minimum of distortion and image blurring because of chromatic errors (dispersion of ion energy). The maximum distortion at this site, as a result of fifth order image errors was $\leq 0.11$ μm, the maximum chromatic aberration was $\leq \pm 0.07$ μm with the mask/wafer spacing of three meters.

If these results are compared with those given in U.S. Pat. No. 4,985,634, one can immediately appreciate the improvement resulting from the use of an asymmetric Einzel lens.

With the machine described in U.S. Pat. No. 4,985,634, for a machine length of 2.1 meter (mask-wafer distance) and an image field of 10×10 mm², a maximum distortion less than 0.2 μm was attained. For comparison of the two systems, distortion values for the same image field sizes had to be compared. Utilizing a transformation for this purpose for an image field of 20×20 mm², the U.S. Patent requires for a maximum distortion of 0.4 μm a machine length of 4.2 m. By contrast, with the invention, using the asymmetric Einzel lens as the second collecting lens L2 the length of the ion projection lithographic systems can be reduced by about 30% and simultaneously the distortion reduced by a factor of 4. These differences can be crucial in many cases with the use of an ion projection lithographic system.

The example shows that a projection lithographic system can be obtained with low ion energy, low distortion, high resolution and telocentricity at the wafer W with all of the combinations. When a mask with only one aperture is used, the lens combinations of the invention allow the single beam of low energy to be employed with high resolution also for the repair of masks and chips or for the modification of chips and masks.

The illumination system which may be used in any of the embodiments of FIGS. 1–3 and as described can be that illustrated diagrammatically in FIG. 4, which comprises downstream of the ion source Q, an Einzel lens EL and is followed by the E×B filter previously described functioning as a mass separator and represented at MF.

Following that mass separator, an illuminating lens BL may be provided which can be an immersion lens, an accelerating or decelerating Einzel lens, or one or more solenoids (see the aforementioned application).

TABLE 1

Ion-optic characteristics of an ion projection lithographic system comprised of an Einzel lens (first collecting Lens L1) and an accelerating asymmetric Einzel lens (second collecting Lens L2).

| | |
|---|---|
| Accelerating Einzel lens (L1): Voltage Ratio | 7.10 |
| Accelerating asymmetric Einzel lens (L2): Voltage Ratios | |
| U2/U1 | 7.6 |
| U3/U1 | 3.8 |
| Spacing Mask - Wafer (m) | 3.01 |
| Reduction Factor | 3 |
| Max. Distortion (μm)[1] | 0.M |
| Max. Chromatic Aberration (μm)[2] | ±0.07 |
| (Ion energy)$_{Wafer}$/(Ion energy)$_{Mask}$ | 3.8 |

[1] For Image Field 20 × 20 mm², Max. Deviation of an Image Point from Ideal Location
[2] For Energy Spread of the Ions at Ion Source Outlet $\Delta E/E = \pm 0.001$, whereby E is the energy of the ions at source outlet.

We claim:

1. An ion-optical imaging system, comprising:
   a mask having a structure to be imaged upon a wafer and including at least one opening;
   means for supporting the wafer upon which said structure is to be imaged at a distance from said mask along an optical axis;
   an ion source disposed along said axis ahead of said mask for generating an ion particle beam imaging immersing said structure of said mask upon said wafer; and
   a lens system disposed between said mask and said wafer and essentially consisting of a set of two collecting lenses including a first collecting lens following said mask along said axis in a direction of ion beam travel toward said wafer, and a second collecting lens spaced from the first collecting lens along said axis in said direction,
   said mask being disposed approximately in the object-side focal plane of the first collecting lens proximal to the mask,
   the wafer being positioned in a vicinity of the image-side focal plane of the second collecting lens following the mask,
   the first collecting lens is an Einzel lens, and the second collecting lens is an accelerating asymmetric Einzel lens having three electrodes at three different potentials.

2. The ion-optical imaging system defined in claim 1 wherein a crossover of the first collecting lens following the mask lies in the object-side focal plane of the second collecting lens following the mask.

3. The ion-optical imaging system defined in claim 2, further comprising:
   a mass separator formed as an E×B filter between said ion source and said mask along said axis;

a condensing lens ahead of said mass separator along said axis; and an illumination lens following said mass separator along said axis.

4. The ion-optical imaging system defined in claim 3 wherein said illumination lens is an immersion lens.

5. The ion-optical imaging system defined in claim 3 wherein said illumination lens is an accelerating Einzel lens.

6. The ion-optical imaging system defined in claim 3 wherein said illumination lens is a decelerating Einzel lens.

7. The ion-optical imaging system defined in claim 3 wherein said illumination lens is at least one solenoid.

8. The ion-optical imaging system defined in claim 3 wherein said condensing lens is an Einzel lens.

9. The ion-optical imaging system defined in claim 3 wherein said first collecting lens is an accelerating Einzel lens.

10. The ion-optical imaging system defined in claim 2 wherein said first collecting lens is an accelerating Einzel lens.

* * * * *